United States Patent
Yu et al.

(10) Patent No.: US 12,212,283 B2
(45) Date of Patent: Jan. 28, 2025

(54) OPERATIONAL AMPLIFIER AND START-UP CIRCUIT OF OPERATIONAL AMPLIFIER

(71) Applicant: HUAWEI TECHNOLOGIES CO., LTD., Shenzhen (CN)

(72) Inventors: Yongchang Yu, Shanghai (CN); Min Yi, Shanghai (CN); Weinan Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 225 days.

(21) Appl. No.: 17/733,359

(22) Filed: Apr. 29, 2022

(65) Prior Publication Data

US 2022/0263470 A1    Aug. 18, 2022

Related U.S. Application Data

(63) Continuation of application No. PCT/CN2019/114257, filed on Oct. 30, 2019.

(51) Int. Cl.
*H03F 1/02*    (2006.01)
*H03F 3/45*    (2006.01)

(52) U.S. Cl.
CPC ....... *H03F 1/0205* (2013.01); *H03F 3/45269* (2013.01)

(58) Field of Classification Search
CPC ............................ H03F 1/0205; H03F 3/45269
USPC ....................................................... 330/253
See application file for complete search history.

(56) References Cited

U.S. PATENT DOCUMENTS

| | | | |
|---|---|---|---|
| 6,642,791 B1* | 11/2003 | Balan | H03F 3/45183 330/253 |
| 7,129,782 B2 | 10/2006 | Lebedev et al. | |
| 7,180,369 B1 | 2/2007 | Cui et al. | |
| 7,453,319 B2 | 11/2008 | Gupta et al. | |
| 9,385,672 B2 | 7/2016 | Karmaker | |
| 11,716,061 B2* | 8/2023 | Modaffari | H03F 3/45475 330/253 |
| 2006/0038618 A1* | 2/2006 | Wang | G05F 3/262 330/288 |

(Continued)

FOREIGN PATENT DOCUMENTS

| | | |
|---|---|---|
| CN | 105159382 A | 12/2015 |
| CN | 108880479 A | 11/2018 |
| CN | 109687832 A | 4/2019 |

*Primary Examiner* — Patricia T Nguyen
(74) *Attorney, Agent, or Firm* — Rimon PC

(57) ABSTRACT

This application provides an operational amplifier and a start-up circuit of the operational amplifier. The start-up circuit has the advantages of having a simple structure and consuming less. The operational amplifier includes a multi-stage amplifier and a start-up circuit, where the start-up circuit includes a first start-up transistor and a second start-up transistor. A source of the first start-up transistor and a source of the second start-up transistor are connected to a tail bias node of a first-stage amplifier in the multi-stage amplifier, a gate of the first start-up transistor and a gate of the second start-up transistor are configured to connect to a first bias voltage $V_b$, and a drain of the first start-up transistor and a drain of the second start-up transistor are connected to input terminals of a second-stage or higher-stage amplifier.

20 Claims, 4 Drawing Sheets

(56) References Cited

U.S. PATENT DOCUMENTS

| | | | |
|---|---|---|---|
| 2009/0015332 A1* | 1/2009 | Oberhuber | H03F 1/30 330/261 |
| 2009/0284242 A1* | 11/2009 | Motz | G05F 3/30 330/253 |
| 2012/0293261 A1 | 11/2012 | Das | |
| 2013/0257513 A1* | 10/2013 | Sanchez | H03F 3/72 330/261 |
| 2016/0352354 A1 | 12/2016 | Tajalli et al. | |
| 2018/0152156 A1 | 5/2018 | Shih | |

* cited by examiner

OPERATIONAL AMPLIFIER AND START-UP CIRCUIT OF OPERATIONAL AMPLIFIER

CROSS-REFERENCE TO RELATED APPLICATIONS

This application is a continuation of International Application No. PCT/CN2019/114257, filed on Oct. 30, 2019, the disclosure of which is hereby incorporated by reference in its entirety.

TECHNICAL FIELD

This application relates to the field of electronic technologies, and in particular, to an operational amplifier and a start-up circuit of the operational amplifier.

BACKGROUND

As one of most basic modules in an analog integrated circuit, operational amplifiers (OPAs) are widely used in various analog circuits and digital-analog hybrid circuits. A radio frequency transceiver system is used as an example. Operational amplifiers are usually used in key modules, for example, a trans-impedance amplifier (TIA), a low-pass filter (LPF), a variable gain amplifier (VGA), an analog to digital converter (ADC), and a digital to analog converter (DAC). In a cascade link system, if pre-circuits or post-circuits of the key modules cannot provide a valid start-up signal, the operational amplifier may not be successfully started and may not operate in a normal amplification operation state. Therefore, an operational amplifier usually needs a start-up circuit to ensure self-start of the operational amplifier. The start-up circuit can provide a start-up current during a start-up process of the operational amplifier, to ensure that each transistor in the operational amplifier operates in a normal amplification operation state. Although in existing circuit designs, start-up circuits can have a plurality of topological structures, the industry has been searching for a start-up circuit with lower power consumption and simpler design.

SUMMARY

This application provides an operational amplifier and a start-up circuit of the operational amplifier. The start-up circuit has advantages of simple structure and low power consumption.

According to a first aspect, an operational amplifier is provided. The operational amplifier includes a multi-stage amplifier and a start-up circuit. The start-up circuit includes a first start-up transistor M16 and a second start-up transistor M17, where a source of the first start-up transistor M16 and a source of the second start-up transistor M17 are connected to a tail bias node of a first-stage amplifier in the multi-stage amplifier, a gate of the first start-up transistor M16 and a gate of the second start-up transistor M17 are configured to connect to a first bias voltage $V_b$, and a drain of the first start-up transistor M16 and a drain of the second start-up transistor M17 are connected to input terminals of a second-stage or higher-stage amplifier.

In the operational amplifier provided in embodiments of this application, the start-up circuit included in the operational amplifier can quickly start the operational amplifier. A structure of the start-up circuit is simple, and no additional zero and pole are introduced. Therefore, bandwidth compensation does not need to be performed for the operational amplifier. This is conducive to a high-speed and high-gain design. In addition, the start-up circuit has a low operating current after the operational amplifier is started, and has an advantage of low power consumption.

With reference to the first aspect, in some possible implementations of the first aspect, the first bias voltage $V_b$ is set, so that $|V_{GS}|>|V_{th}|$ when an input transistor pair of the first-stage amplifier is not turned on, and $|V_{GS}|<|V_{th}|$ after the operational amplifier is started, where $V_{GS}$ represents a gate-source voltage of each of the first start-up transistor M16 and the second start-up transistor M17, and $V_{th}$ represents a threshold voltage of each of the first start-up transistor M16 and the second start-up transistor M17.

In some embodiments of this application, the first bias voltage Vb can be configured, so that after the start-up circuit of the operational amplifier is started. Therefore, in an ideal state, the operating current of the start-up circuit is zero. In this way, no additional direct current offset is introduced, performance of the operational amplifier is improved, and power consumption is reduced.

With reference to the first aspect, in some possible implementations of the first aspect, the tail bias node is a drain of a tail bias transistor M5 of the first-stage amplifier.

With reference to the first aspect, in some possible implementations of the first aspect, the tail bias node is a terminal of a bias resistor of the first-stage amplifier.

With reference to the first aspect, in some possible implementations of the first aspect, the operational amplifier includes a three-stage amplifier, where the drain of the first start-up transistor M16 is connected to a gate of a third input transistor M7 of a second-stage amplifier, and the drain of the second start-up transistor M17 is connected to a gate of a fourth input transistor M9 of the second-stage amplifier.

With reference to the first aspect, in some possible implementations of the first aspect, the operational amplifier further includes a stability compensation circuit. The stability compensation circuit includes a first resistor R1, a second resistor R2, a first capacitor C1, and a second capacitor C2, where a first terminal of the first capacitor C1 is connected to a drain of the third input transistor M7 of the second-stage amplifier, a second terminal of the first capacitor C1 is connected to a first terminal of the first resistor R1, and a second terminal of the first resistor R1 is connected to a drain of a first input transistor M1 of the first-stage amplifier; and a first terminal of the second capacitor C2 is connected to a drain of the fourth input transistor M9 of the second-stage amplifier, a second terminal of the second capacitor C2 is connected to a first terminal of the second resistor R2, and a second terminal of the second resistor R2 is connected to a drain of a second input transistor M2 of the first-stage amplifier.

With reference to the first aspect, in some possible implementations of the first aspect, the operational amplifier further includes a common mode detection circuit. The common mode detection circuit includes: a first input terminal, configured to receive a first differential output voltage Voutp output by the operational amplifier; a second input terminal, configured to receive a second differential output voltage Voutn output by the operational amplifier; and an output terminal, configured to output a common mode output voltage $V_{CM}$, where the common mode output voltage $V_{CM}$ is an average value of the first differential output voltage Voutp and the second differential output voltage Voutn.

With reference to the first aspect, in some possible implementations of the first aspect, the common mode detection circuit includes a third resistor R3 and a fourth resistor R4, where a first terminal of the third resistor R3 is connected to a first differential output terminal of the operational amplifier, a second terminal of the third resistor R3 is connected to a first terminal of the fourth resistor R4, a second terminal of the fourth resistor R4 is connected to a second differential output terminal of the operational amplifier, and the second terminal of the third resistor R3 is an output terminal of the common mode detection circuit.

With reference to the first aspect, in some possible implementations of the first aspect, the operational amplifier further includes a common mode loop compensation circuit. The common mode loop compensation circuit includes a third capacitor C3 and a fourth capacitor C4, where a first terminal of the third capacitor C3 is connected to the first differential output terminal of the operational amplifier, a second terminal of the third capacitor C3 is connected to a first terminal of the fourth capacitor C4, and a second terminal of the fourth capacitor C4 is connected to the second differential output terminal of the operational amplifier.

With reference to the first aspect, in some possible implementations of the first aspect, the operational amplifier further includes a common mode negative feedback circuit. The common mode negative feedback circuit includes an error amplifier, where a first input terminal of the error amplifier is configured to receive a common mode reference voltage $V_{CMREF}$ of the operational amplifier, a second input terminal of the error amplifier is configured to receive the common mode output voltage $V_{CM}$ output by the common mode detection circuit, and an output terminal of the error amplifier is connected to a bias circuit of the operational amplifier.

According to a second aspect, a start-up circuit of an operational amplifier is provided. The operational amplifier includes a multi-stage amplifier. The start-up circuit includes a first start-up transistor M16 and a second start-up transistor M17, where a source of the first start-up transistor M16 and a source of the second start-up transistor M17 are connected to a tail bias node of a first-stage amplifier in the multi-stage amplifier, a gate of the first start-up transistor M16 and a gate of the second start-up transistor M17 are configured to connect to a first bias voltage $V_b$, and a drain of the first start-up transistor M16 and a drain of the second start-up transistor M17 are connected to input terminals of a second-stage or higher-stage amplifier.

The start-up circuit provided in embodiments of this application can quickly start the operational amplifier. A structure of the start-up circuit is simple, and no additional zero and pole are introduced. Therefore, bandwidth compensation does not need to be performed for the operational amplifier. This is conducive to a high-speed and high-gain design. In addition, the start-up circuit has a low operating current after the operational amplifier is started, and has an advantage of low power consumption.

With reference to the second aspect, in some possible implementations of the second aspect, the first bias voltage $V_b$ is set, so that $|V_{GS}|>|V_{th}|$ when an input transistor pair of the first-stage amplifier is not turned on, and $|V_{GS}|<|V_{th}|$ after the operational amplifier is started, where $V_{GS}$ represents a gate-source voltage of each of the first start-up transistor M16 and the second start-up transistor M17, and $V_{th}$ represents a threshold voltage of each of the first start-up transistor M16 and the second start-up transistor M17.

With reference to the second aspect, in some possible implementations of the second aspect, the tail bias node is a drain of a tail bias transistor M5 of the first-stage amplifier.

With reference to the second aspect, in some possible implementations of the second aspect, the tail bias node is a terminal of a bias resistor of the first-stage amplifier.

With reference to the second aspect, in some possible implementations of the second aspect, the operational amplifier includes a three-stage amplifier, where the drain of the first start-up transistor M16 is connected to a gate of a third input transistor M7 of a second-stage amplifier, and the drain of the second start-up transistor M17 is connected to a gate of a fourth input transistor M9 of the second-stage amplifier.

With reference to the second aspect, in some possible implementations of the second aspect, the operational amplifier further includes:

a stability compensation circuit, including a first resistor R1, a second resistor R2, a first capacitor C1, and a second capacitor C2, where a first terminal of the first capacitor C1 is connected to a drain of the third input transistor M7 of the second-stage amplifier, a second terminal of the first capacitor C1 is connected to a first terminal of the first resistor R1, and a second terminal of the first resistor R1 is connected to a drain of a first input transistor M1 of the first-stage amplifier; and a first terminal of the second capacitor C2 is connected to a drain of the fourth input transistor M9 of the second-stage amplifier, a second terminal of the second capacitor C2 is connected to a first terminal of the second resistor R2, and a second terminal of the second resistor R2 is connected to a drain of a second input transistor M2 of the first-stage amplifier.

With reference to the second aspect, in some possible implementations of the second aspect, the operational amplifier further includes a common mode detection circuit. The common mode detection circuit includes: a first input terminal, configured to receive a first differential output voltage Voutp output by the operational amplifier; a second input terminal, configured to receive a second differential output voltage Voutn output by the operational amplifier; and an output terminal, configured to output a common mode output voltage $V_{CM}$, where the common mode output voltage $V_{CM}$ is an average value of the first differential output voltage Voutp and the second differential output voltage Voutn.

With reference to the second aspect, in some possible implementations of the second aspect, the common mode detection circuit includes a third resistor R3 and a fourth resistor R4, where a first terminal of the third resistor R3 is connected to a first differential output terminal of the operational amplifier, a second terminal of the third resistor R3 is connected to a first terminal of the fourth resistor R4, a second terminal of the fourth resistor R4 is connected to a second differential output terminal of the operational amplifier, and the second terminal of the third resistor R3 is an output terminal of the common mode detection circuit.

With reference to the second aspect, in some possible implementations of the second aspect, the operational amplifier further includes a common mode loop compensation circuit. The common mode loop compensation circuit includes a third capacitor C3 and a fourth capacitor C4, where a first terminal of the third capacitor C3 is connected to the first differential output terminal of the operational amplifier, a second terminal of the third capacitor C3 is connected to a first terminal of the fourth capacitor C4, and a second terminal of the fourth capacitor C4 is connected to the second differential output terminal of the operational amplifier.

With reference to the second aspect, in some possible implementations of the second aspect, the operational amplifier further includes: a common mode negative feedback circuit. The common mode negative feedback circuit includes an error amplifier, where a first input terminal of the error amplifier is configured to receive a common mode reference voltage $V_{CMREF}$ of the operational amplifier, a second input terminal of the error amplifier is configured to receive the common mode output voltage $V_{CM}$ output by the common mode detection circuit, and an output terminal of the error amplifier is connected to a bias circuit of the operational amplifier.

According to a third aspect, a chip is provided. The chip includes the operational amplifier according to the first aspect or any possible implementation of the first aspect.

According to a fourth aspect, an electronic device is provided. The electronic device includes the operational amplifier according to the first aspect or any possible implementation of the first aspect.

DESCRIPTION OF EMBODIMENTS

The following describes technical solutions of this application with reference to the accompanying drawings.

Embodiments of this application provide an operational amplifier and a start-up circuit of the operational amplifier. The start-up circuit has advantages of simple circuit structure and low power consumption, and can quickly start the operational amplifier.

Figure 1:
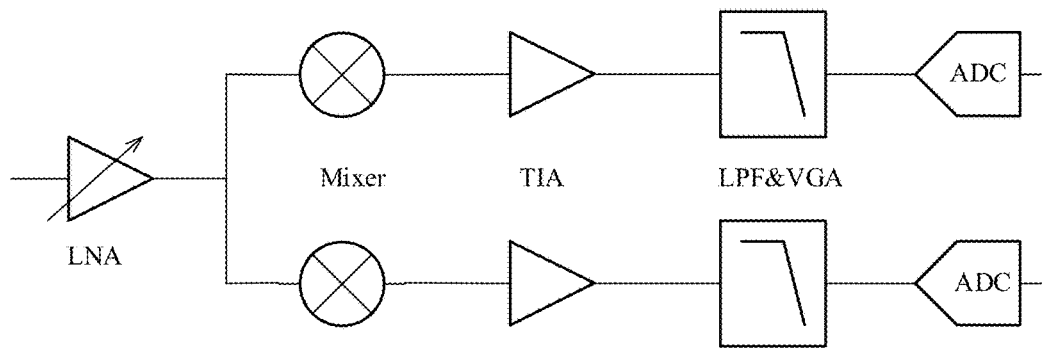
FIG. 1 is a schematic diagram of an application environment according to an embodiment of this application.

FIG. 1 is a schematic diagram of an application environment according to an embodiment of this application. FIG. 1 is a schematic diagram of link cascading in a radio frequency system. The radio frequency system is a receiver system, and includes a low-noise amplifier (LNA), a mixer, a trans-impedance amplifier (TIA), a low-pass filter (LPF), and an analog to digital converter (ADC). The operational amplifier in embodiments of this application may be disposed in modules in FIG. 1, for example, the TIA, the LPF, a VGA, and the ADC. It should be noted that FIG. 1 is merely used as an example to describe the application environment of the operational amplifier in embodiments of this application, and the operational amplifier may be widely used in various analog integrated circuits or digital-analog integrated circuits. For example, the operational amplifier may be used in a filter circuit, an amplification circuit, an operation circuit, a signal generation circuit, a signal conversion circuit, or a power supply.

After the operational amplifier is started, there are usually two stable states: a normal amplification operation state and an abnormal amplification operation state. The abnormal amplification operation state may refer to that an input voltage of the operational amplifier exceeds a normal input voltage range of the operational amplifier. The abnormal amplification operation state includes two cases: a low input bias and a high input bias. The low input bias refers to that the input voltage of the operational amplifier is lower than a lower limit of the normal input voltage range of the operational amplifier, and the high input bias refers to that the input voltage of the operational amplifier is higher than an upper limit of the normal input voltage range of the operational amplifier. When the operational amplifier is in the abnormal amplification operation state, operation performance of the operational amplifier in a circuit module or circuit system is affected. For example, in the abnormal amplification operation state, an input transistor pair of the operational amplifier may be in a sub-threshold region, and an operating current is much lower than an expected value. Consequently, various characteristic parameters of a circuit are affected, and the circuit is deviated from design indexes.

If a pre-circuit or post-circuit of a module in which the operational amplifier is located cannot provide a valid start-up signal, the operational amplifier cannot operate in the normal amplification operation state, but operates in the abnormal amplification operation state. To ensure that the operational amplifier operates in the normal amplification operation state after being started, the operational amplifier usually needs a start-up circuit to ensure self start-up of the operational amplifier. The start-up circuit can provide a start-up current during a start-up process of the operational amplifier, to ensure that each transistor in the operational amplifier operates in the normal amplification operation state.

In a conventional technology, there are various start-up circuits with different principles and topological structures. However, an existing start-up circuit has a deficiency. For example, because a large quantity of start-up loop stages are implemented during a start-up process of the start-up circuit, an additional stability compensation design is needed. Alternatively, the start-up circuit still operates after being started. Consequently, additional power consumption is consumed. In addition, the start-up circuit is complex in design and occupies a large chip area.

Therefore, embodiments of this application provide a start-up circuit, to quickly start the operational amplifier. A structure of the start-up circuit is simple, and performance of a main signal channel is not affected. In addition, the start-up circuit has a low operating current after the operational amplifier is started, and has an advantage of low power consumption. Refer to FIG. 2 to FIG. 5. The following describes in detail an operational amplifier and a start-up circuit of the operational amplifier that are provided in embodiments of this application.

Figure 2:
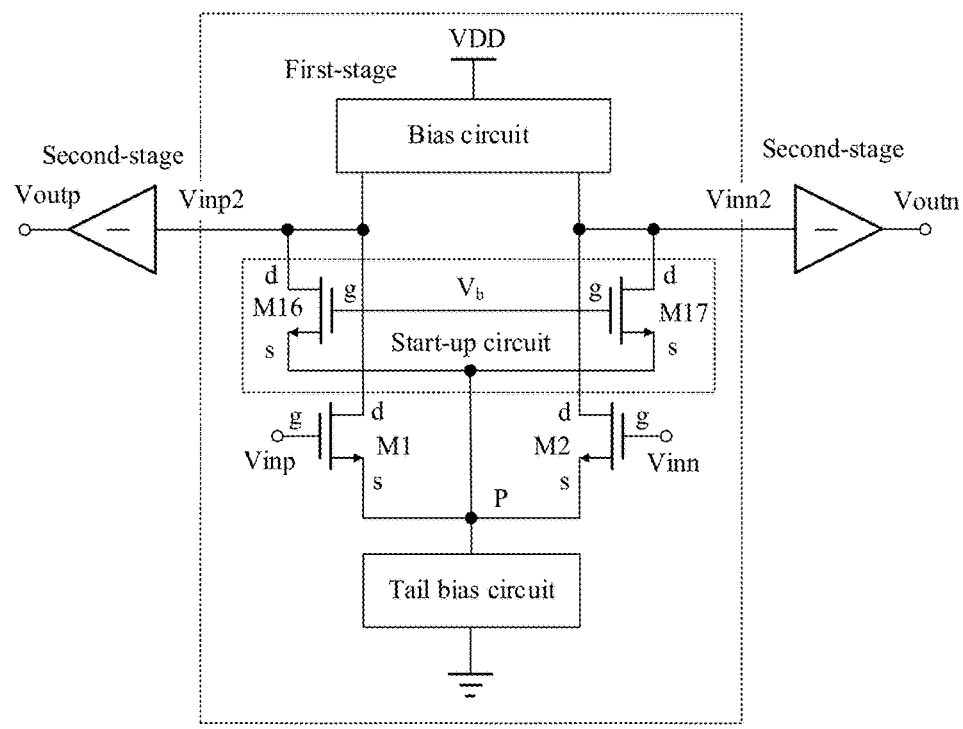
FIG. 2 is a schematic diagram of a structure of an operational amplifier according to an embodiment of this application.

FIG. 2 is a schematic diagram of a structure of an operational amplifier 200 according to an embodiment of this application. The operational amplifier 200 may include a multi-stage amplifier, for example, the operational amplifier 200 may be a two-stage amplifier, a three-stage amplifier, or a higher-stage amplifier. In FIG. 2, that the operational amplifier 200 is a two-stage amplifier is used as an example for description.

As shown in FIG. 2, the operational amplifier 200 includes a first-stage amplifier, a second-stage amplifier, and a start-up circuit. An input terminal of the operational amplifier 200 may be a differential input terminal. An output terminal of the operational amplifier 200 may be a differential output terminal, or may be a single output terminal. This is not limited in this embodiment of this application. If input terminals of the operational amplifier 200 are differential intput terminals, the differential input terminals may be respectively referred to as a first differential input terminal Vinp and a second differential input terminal Vinn. Differential output terminals of the operational amplifier may be respectively referred to as a first differential output terminal Voutp and a second differential output terminal Voutn.

The first-stage amplifier includes a bias circuit, a tail bias circuit, and an input transistor pair (M1, M2). For ease of description, the transistor M1 and the transistor M2 may be referred to as a first input transistor M1 and a second input transistor M2, or collectively referred to as an input transistor pair of the first-stage amplifier. Gates (g) of the input transistor pair (M1, M2) are respectively the differential input terminals (Vinp, Vinn) of the operational amplifier 200. Sources (s) of the input transistor pair (M1, M2) are connected to the tail bias circuit, and drains (d) of the input transistor pair (M1, M2) are connected to the bias circuit. Drains (d) of the input transistor pair (M1, M2) are output terminals of the first-stage amplifier, and are connected to input terminals of the second-stage amplifier. The tail bias circuit and the bias circuit are configured to provide a bias current for the input transistor pair (M1, M2).

Still refer to FIG. 2. The start-up circuit includes a first start-up transistor M16 and a second start-up transistor M17, where the first start-up transistor M16 and the second start-up transistor M17 form a differential transistor pair. For ease of description, the transistor M16 and the transistor M17 may be collectively referred to as a start-up transistor pair. Sources (s) of the start-up transistor pair (M16, M17) are connected to a tail bias node P of the first-stage amplifier, gates (g) of the start-up transistor pair (M16, M17) are configured to connect to a first bias voltage $V_b$, and drains (d) of the start-up transistor pair (M16, M17) may be connected to the input terminals of the second-stage amplifier or input terminals of a higher-stage amplifier. As an example, the drains (d) of the start-up transistor pair (M16, M17) shown in FIG. 2 are connected to the input terminals of the second-stage amplifier.

The tail bias node P of the first-stage amplifier may refer to a node at which the tail bias circuit of the first-stage amplifier is connected to the sources(s) of the input transistor pair (M1, M2). For example, the tail bias circuit may include a tail bias transistor, and the tail bias node P may be a drain of the tail bias transistor of the first-stage amplifier. Alternatively, the tail bias circuit may include a bias resistor, and the tail bias node P is a terminal of the bias resistor of the first-stage amplifier. Alternatively, the tail bias node P may be the sources(s) of the input transistor pair (M1, M2). In some embodiments of this application, a voltage at the tail bias node P may be represented by $V_p$.

An input terminal of the second-stage or higher-stage amplifier may be a differential input terminal. For example, differential input terminals of the second-stage amplifier may include a first differential input terminal Vinp2 and a second differential input terminal Vinn2. In some examples, the drains (d) of the start-up transistors M16 and M17 may be respectively connected to the two differential input terminals of the second-stage or higher-stage amplifier. As shown in FIG. 2, the drain (d) of the first start-up transistor M16 is connected to the first differential input terminal Vinp2 of the second-stage amplifier, and the drain (d) of the second start-up transistor M17 is connected to the second differential input terminal Vinn2 of the second-stage amplifier.

In some examples, a connection manner of the sources (s) and the drains (d) of the start-up transistor pair (M16, M17) is the same as a connection manner of the sources (s) and the drains (d) of the input transistor pair (M1, M2) of the first-stage amplifier. To be specific, the sources (s) of the start-up transistor pair (M16, M17) are connected to a same node as the sources (s) of the input transistor pair (M1, M2), and the drains (d) of the start-up transistor pair (M16, M17) are connected to a same node as the drains (d) of the input transistor pair (M1, M2).

After the operational amplifier 200 is powered on, bias voltages in the circuit are first established, for example, the first bias voltage $V_b$ and bias voltages in the tail bias circuit and the bias circuit. After the bias voltages are established, the start-up transistors (M16, M17) are first turned on to generate an operating current and drive the second-stage amplifier of the operational amplifier to operate. After the second-stage amplifier is started, the input transistor pair (M1, M2) is driven by an external loop feedback to operate, so that the operational amplifier 200 enters a normal operation state, thereby completing start-up of the operational amplifier 200.

In some examples, to successfully turn on the start-up transistors (M16, M17) after the operational amplifier 200 is powered on, the first bias voltage $V_b$ is set, so that $|V_{GS}|>|V_{th}|$ before the operational amplifier 200 is started, where $V_{GS}$ represents a gate-source voltage of each of the start-up transistor pair (M16, M17), and $V_{th}$ represents a threshold voltage of each of the start-up transistor pair (M16, M17). When $|V_{GS}|>|V_{th}|$ the start-up transistor pair (M16, M17) is in an on state. Therefore, after the operational amplifier 200 is powered on, the start-up transistor pair (M16, M17) is first turned on, and the operating current is generated, to start the operational amplifier. The gate-source voltage $V_{GS}$ of each of the start-up transistor pair (M16, M17) may be represented as $V_{GS}=V_b-V_p$, where $V_p$ represents the voltage at the tail bias node P. After the start-up circuit is started, the first-stage amplifier normally operates, and the tail bias circuit provides a bias current for the input transistor pair (M1, M2). In this case, the voltage $V_p$ at the tail bias node P increases, and a magnitude of the first bias voltage $V_b$ remains unchanged. Therefore, the gate-source voltage $V_{GS}=V_b-V_p$ of each of the start-up transistor pair (M16, M17) decreases, so that the operating current of the start-up transistor pair (M16, M17) starts to decrease, and power consumption of the start-up circuit is also reduced.

In some examples, to reduce the operating current of the start-up transistors (M16, M17) after the operational amplifier 200 is started, the first bias voltage $V_b$ is set, so that $|V_{GS}|<|V_{th}|$ after the operational amplifier 200 is started. If the first bias voltage $V_b$ is reasonably set, $|V_{GS}|<|V_{th}|$ after the operational amplifier 200 is started (that is, after the operational amplifier 200 is in a normal amplification operation state). In this case, the start-up transistor pair (M16, M17) is in an off state. In an ideal state, the operating current of the start-up transistor pair (M16, M17) is zero, thereby reducing the power consumption of the start-up circuit.

A structure of the start-up circuit of the operational amplifier in embodiments of this application is simple, and can be implemented with only two transistors. After the operational amplifier 200 is started, because the gate-source voltage $V_{GS}$ of each of the start-up transistors (M16, M17) decreases, the operating current $I_D$ of the start-up circuit after the operational amplifier is started is small. This is conducive to implementing a circuit with low power consumption. For ease of description, Formula (1) shows an operating current formula of the transistors when the transistors operate in a saturation region.

$$I_D = \mu C_{ox} \frac{W}{2L}(V_{GS} - V_{th})^2 \quad (1)$$

$I_D$ represents an operating current, $\mu$ represents mobility of carriers, $C_{ox}$ represents a unit area capacitance of a gate oxide layer of a transistor, W represents a channel width of the transistor, L represents a channel length of the transistor, $V_{GS}$ represents a gate-source voltage of the transistor, and $V_{th}$ represents a threshold voltage of the transistor.

It can be seen from Formula (1) that, as $V_{GS}$ decreases, the operating current $I_D$ decreases. If $V_{GS}$ is less than $V_{th}$, an operation state of a MOS transistor enters a cutoff region. In an ideal state, the operating current $I_D$ is zero.

In some examples, the first bias voltage $V_b$ may be set to be equal to a common mode reference voltage $V_{CMREF}$ of the operational amplifier 200.

A loop of the start-up circuit in embodiments of this application is simple, and no additional zero and pole are introduced. Therefore, bandwidth compensation does not need to be performed for the operational amplifier. This is conducive to a high-speed and high-gain design.

The start-up circuit in some embodiments of this application uses a differential structure, and has a good differential characteristic. In addition, after the operational amplifier is started, the operating current of the start-up circuit decreases, or is even zero, so that no additional direct current offset (DC offset) is introduced. This is conducive to an advanced low-voltage process design.

Optionally, the start-up transistor pair (M16, M17) may be N-type metal-oxide-semiconductor (NMOS) transistors or P-type metal-oxide-semiconductor (PMOS) transistors. For example, a type of the start-up transistor pair (M16, M17) may be the same as a type of the input transistor pair (M1, M2) of the first-stage amplifier. If the input transistors (M1, M2) are NMOS transistors, the start-up transistors (M16, M17) are NMOS transistors. If the input transistors (M1, M2) are PMOS transistors, the start-up transistors (M16, M17) are PMOS transistors.

Optionally, the operational amplifier in some embodiments of this application may use a complementary metal oxide semiconductor (CMOS) process, or may use another integrated circuit process. For example, the operational amplifier may use a bipolar junction transistor (BJT) process or a silicon-on-insulator (SOI) process.

Figure 3:
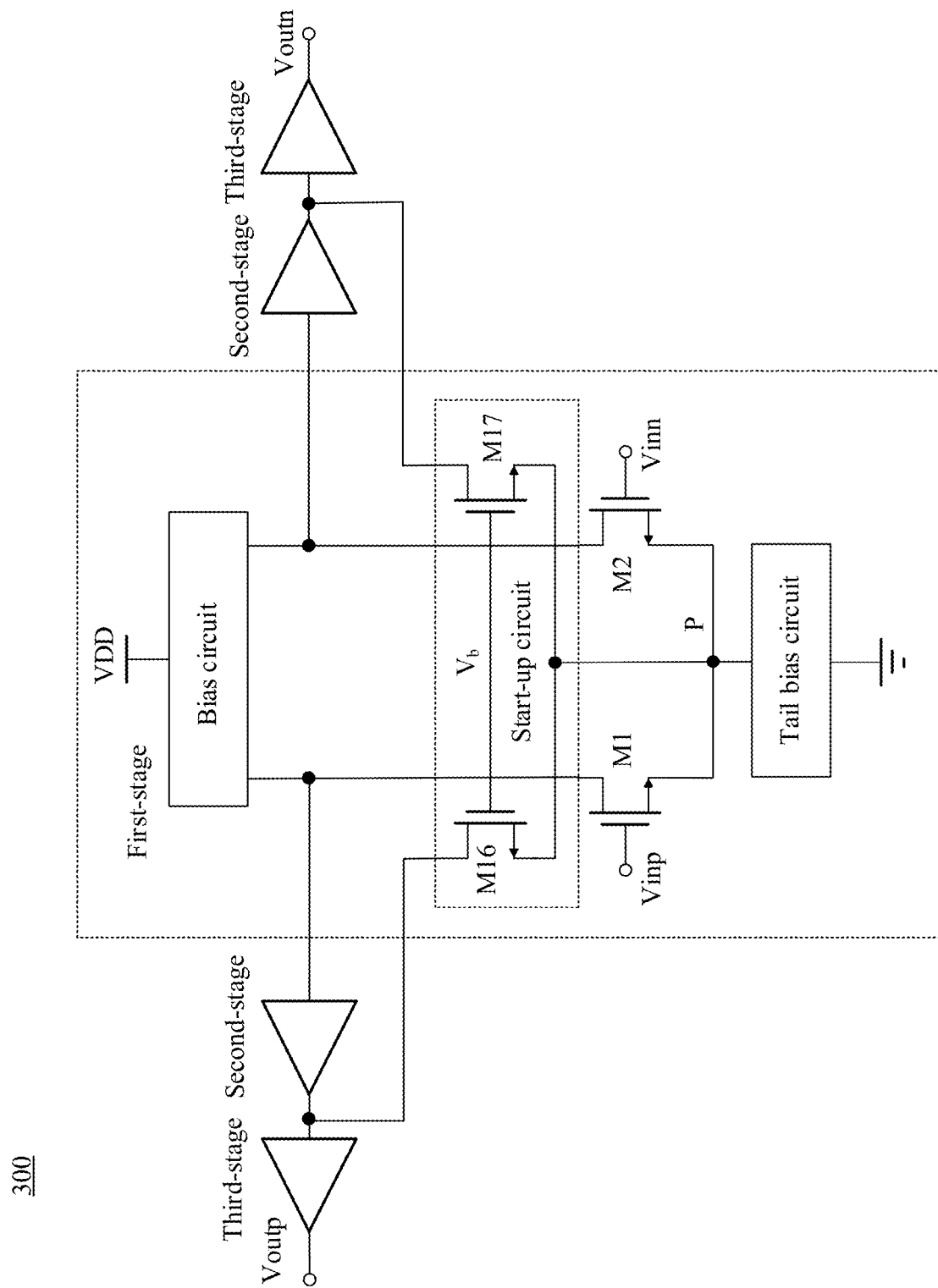
FIG. 3 is a schematic diagram of a structure of an operational amplifier according to another embodiment of this application.

FIG. 3 is a schematic diagram of a structure of an operational amplifier 300 according to another embodiment of this application. A structure of the operational amplifier 300 in FIG. 3 is similar to the structure of the operational amplifier 200 in FIG. 2, and a difference lies in that the drains of the start-up transistor pair (M16, M17) are respectively connected to two differential input terminals of a third-stage amplifier. To be specific, the drain of the first start-up transistor M16 is connected to a first differential input terminal of the third-stage amplifier, and the drain (d) of the second start-up transistor M17 is connected to a second differential input terminal of the third-stage amplifier.

Figure 4:
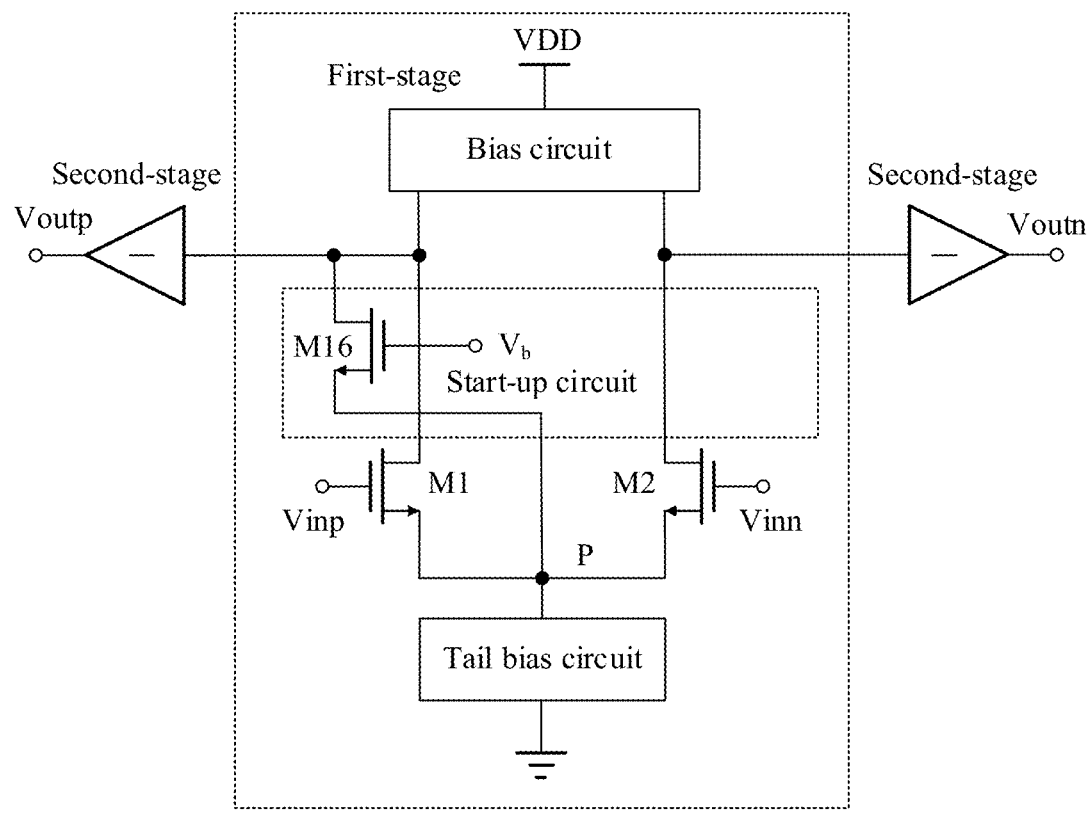
FIG. 4 is a schematic diagram of a structure of an operational amplifier according to another embodiment of this application.

Optionally, the start-up transistor pair (M16, M17) in one embodiment of this application may be alternatively replaced by a single transistor. For example, FIG. 4 is a schematic diagram of a structure of an operational amplifier 400 according to another embodiment of this application. As shown in FIG. 4, a start-up circuit may include only a first start-up transistor M16, where a source of the first start-up transistor M16 is configured to connect to a tail bias node P, a gate of the first start-up transistor M16 is configured to connect to a first bias voltage Vb, and a drain of the first start-up transistor M16 is configured to connect to an input terminal of a second-stage or higher-stage amplifier. The drain of the first start-up transistor M16 in FIG. 4 is configured to connect to any one of two differential input terminals of the second-stage amplifier. In some examples, the drain of the first start-up transistor M16 may be alternatively configured to connect to any one of two differential input terminals of the higher-stage amplifier.

Figure 5:
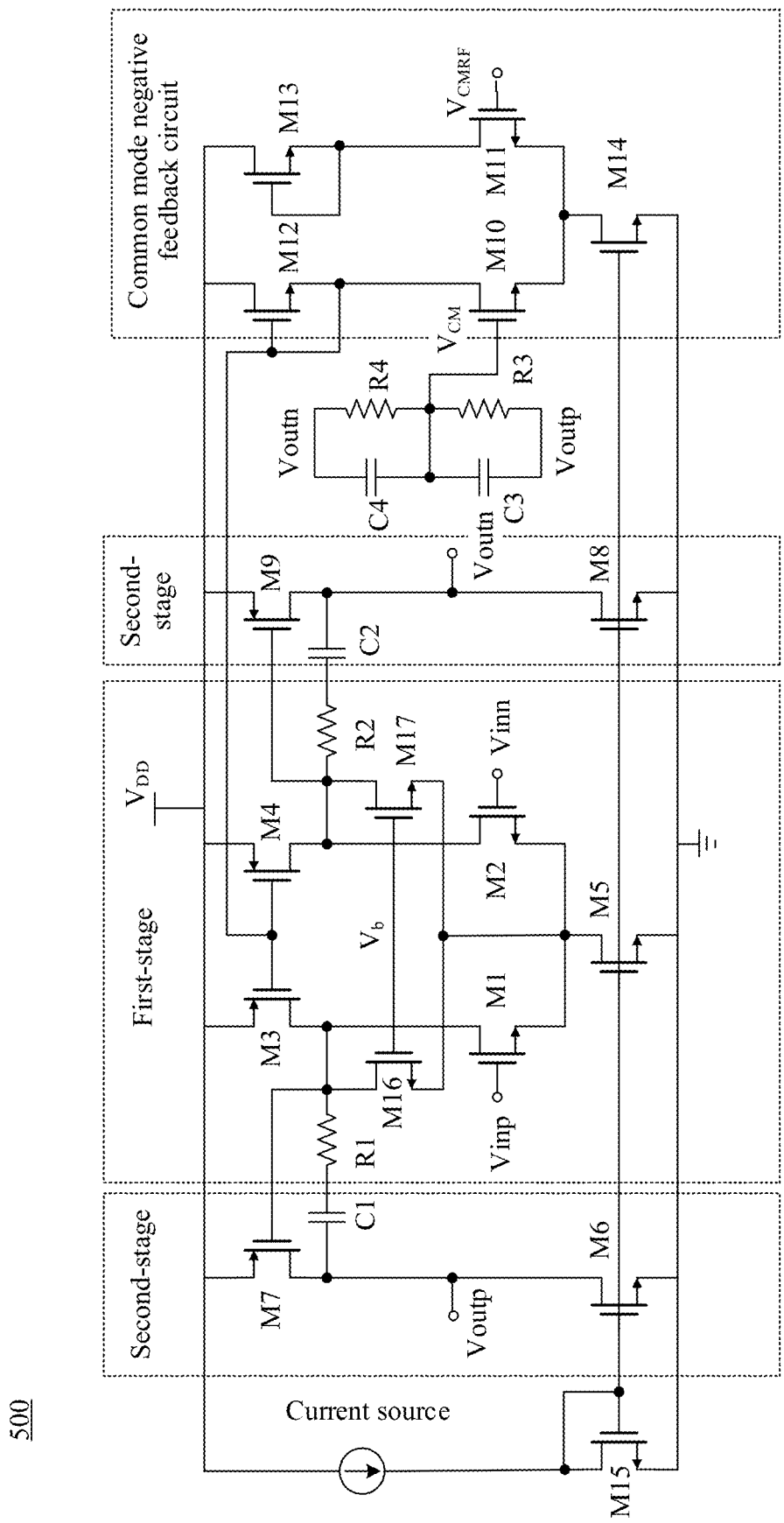
FIG. 5 is a schematic diagram of a circuit structure of an operational amplifier according to an embodiment of this application.

FIG. 5 is a schematic diagram of a circuit structure of an operational amplifier 500 according to another embodiment of this application. The operational amplifier 500 in FIG. 5 is a two-stage amplifier. It should be understood that after limited deformation, a structure of the operational amplifier 500 is also applicable to a three-stage amplifier or a higher-stage amplifier. As shown in FIG. 5, a first-stage amplifier circuit of the operational amplifier includes transistors M1, M2, M3, M4, and M5. The bias circuit of the first-stage amplifier in FIG. 2 to FIG. 4 may include the transistors M3 and M4 in FIG. 5. The tail bias circuit of the first-stage amplifier in FIG. 2 to FIG. 4 may include the transistor M5 in FIG. 5. For ease of description, the transistors M3 and M4 may be referred to as bias transistors, and the transistor M5 may be referred to as a tail bias transistor. A second-stage amplifier circuit of the operational amplifier includes transistors M6, M7, M8, and M9.

In the first-stage amplifier circuit, sources of the bias transistors M3 and M4 are connected to a power supply $V_{DD}$, and drains of the bias transistors M3 and M4 are connected to drains of the input transistor pair (M1, M2). The transistor M7 and the transistor M9 are an input transistor pair of the second-stage amplifier. For ease of description, the transistor M7 and the transistor M9 may be referred to as a third input transistor M7 and a fourth input transistor M9 of the second-stage amplifier. A gate of the third input transistor M7 is a first differential input terminal of the second-stage amplifier, and a gate of the fourth input transistor M9 is a second differential input terminal of the second-stage amplifier. A drain of the third input transistor M7 is a first differential output terminal of the second-stage amplifier, a drain of the fourth input transistor M9 is a second differential output terminal of the second-stage amplifier, and the drains of the third input transistor M7 and the fourth input transistor M9 are also differential output terminals of the operational amplifier.

As shown in FIG. 5, a start-up circuit includes a first start-up transistor M16 and a second start-up transistor M17. Gates of the first start-up transistor M16 and the second start-up transistor M17 are configured to connect to a first bias voltage $V_b$. Sources of the first start-up transistor M16 and the second start-up transistor M17 are connected, and are connected to a drain of the tail bias transistor M5. A drain of the first start-up transistor M16 is connected to the gate of the third input transistor M7 of the second-stage amplifier, and a drain of the second start-up transistor M17 is connected to the gate of the fourth input transistor M9 of the second-stage amplifier. The drain of the third input transistor M7 is a differential output terminal Voutp of the operational amplifier, and the drain of the fourth input transistor M9 is a differential output terminal Voutn of the operational amplifier.

Optionally, the operational amplifier further includes a stability compensation circuit, and the stability compensation circuit may be used for frequency compensation of a fully differential amplifier. As shown in FIG. 5, as an example, the stability compensation circuit includes a first resistor R1, a second resistor R2, a first capacitor C1, and a second capacitor C2. The drain of the third input transistor M7 is connected to a first terminal of the first capacitor C1, a second terminal of the first capacitor C1 is connected to a first terminal of the first resistor R1, and a second terminal of the first resistor R1 is connected to a drain of a first input transistor M1 of a first stage amplifier. The drain of the fourth input transistor M9 is connected to a first terminal of the second capacitor C2, a second terminal of the second capacitor C2 is connected to a first terminal of the second resistor R2, and a second terminal of the second resistor R2 is connected to a drain of a second input transistor M2 of the first-stage amplifier. A transistor M15 is a current mirror bias circuit of the operational amplifier, and is configured to receive a bias current and generate a bias voltage for the operational amplifier. A transistor M12 and a transistor M13 are diode-connected and constitute a load of an error amplifier in a common mode negative feedback circuit.

Optionally, the operational amplifier further includes a common mode detection circuit, and the common mode detection circuit is configured to generate a common mode output voltage $V_{CM}$ of the operational amplifier. The common mode detection circuit includes: a first input terminal, configured to receive a first differential output voltage Voutp output by the operational amplifier; a second input terminal, configured to receive a second differential output voltage Voutn output by the operational amplifier; and an output terminal, configured to output the common mode output voltage $V_{CM}$, where the common mode output voltage $V_{CM}$ is an average value of the first differential output voltage Voutp and the second differential output voltage Voutn, that is, $V_{CM}=(Voutp+Voutn)/2$.

As shown in FIG. 5, as an example, the common mode detection circuit includes a third resistor R3 and a fourth resistor R4, where a first terminal of the third resistor R3 is connected to a first differential output terminal Voutp of the operational amplifier, a second terminal of the third resistor R3 is connected to a first terminal of the fourth resistor R4, a second terminal of the fourth resistor R4 is connected to a second differential output terminal Voutn of the operational amplifier, and the second terminal of the third resistor R3 is an output terminal of the common mode detection circuit.

Optionally, the operational amplifier further includes a common mode loop compensation circuit, and the common mode loop compensation circuit is configured to compensate for frequency of a common mode loop. As shown in FIG. 5, as an example, the common mode loop compensation circuit includes a third capacitor C3 and a fourth capacitor C4, where a first terminal of the third capacitor C3 is connected to the first differential output terminal Voutp of the operational amplifier, a second terminal of the third capacitor C3 is connected to a first terminal of the fourth capacitor C4, and a second terminal of the fourth capacitor C4 is connected to the second differential output terminal Voutn of the operational amplifier. The second terminal of the third capacitor C3 is connected to the output end of the common mode detection circuit. In other words, the second terminal of the third capacitor C3 is connected to the second terminal of the third resistor R3.

Optionally, the operational amplifier further includes a common mode negative feedback circuit, where the common mode negative feedback circuit is configured to compare the common mode output voltage $V_{CM}$ with a common mode reference voltage $V_{CMREF}$, and adjust a bias circuit of the operational amplifier based on a comparison result, so that the common mode output voltage $V_{CM}$ is equal to the common mode reference voltage $V_{CMREF}$. As shown in FIG. 5, the common mode negative feedback circuit includes the error amplifier, a first input terminal of the error amplifier is configured to connect to the common mode reference voltage $V_{CMREF}$ of the operational amplifier, and a second input terminal of the error amplifier is configured to connect to the common mode output voltage $V_{CM}$ of the operational amplifier, that is, to connect to the second terminal of the third resistor R3. An output terminal of the error amplifier is connected to the bias circuit of the operational amplifier, to adjust the bias circuit of the operational amplifier.

As shown in FIG. 5, as an example, the error amplifier includes transistors M10, M11, M12, M13, and M14. The transistor M10 and the transistor M11 are amplifier transistors, and the transistors M12, M13, and M14 are bias transistors. Gates of the transistor M10 and the transistor M11 are differential input terminals of the error amplifier, and a drain of the transistor M10 is an output terminal of the error amplifier. The gate of the transistor M10 in the common mode negative feedback circuit is connected to the second terminal of the third resistor R3 in the common mode detection circuit. The gate of the transistor M11 in the common mode negative feedback circuit is configured to connect to the common mode reference voltage $V_{CMREF}$.

It should be understood that FIG. 5 is merely an example rather than a limitation of a specific circuit structure of the operational amplifier in embodiments of this application. For example, the stability compensation circuit, the common mode detection circuit, the common mode loop compensation circuit, or the common mode negative feedback circuit in FIG. 5 may also be implemented in another manner. This is not limited in this embodiment of this application.

A person of ordinary skill in the art may be aware that units and algorithm steps in the examples described with reference to the embodiments disclosed in this specification can be implemented by electronic hardware or a combination of computer software and electronic hardware. Whether the functions are performed by hardware or software depends on specific applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed systems, apparatuses, and methods may be implemented in another manner. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An operational amplifier, comprising:
   a multi-stage amplifier; and
   a start-up circuit, comprising a first start-up transistor and a second start-up transistor, wherein a source of the first start-up transistor and a source of the second start-up transistor are connected to a tail bias node of a first-stage amplifier in the multi-stage amplifier, a gate of the first start-up transistor and a gate of the second start-up transistor are configured to connect to a first bias voltage, and a drain of the first start-up transistor and a drain of the second start-up transistor are connected to input terminals of a second or higher-stage amplifier.

2. The operational amplifier according to claim 1, wherein the first bias voltage is set, so that
   when an input transistor pair of the first-stage amplifier is not turned on, $|V_{GS}|>|V_{th}|$, and
   after the operational amplifier is started, $|V_{GS}|<|V_{th}|$, wherein $V_{GS}$ represents a gate-source voltage of each of the first start-up transistor and the second start-up transistor, and $V_{th}$ represents a threshold voltage of each of the first start-up transistor and the second start-up transistor.

3. The operational amplifier according to claim 1, wherein the tail bias node is a drain of a tail bias transistor of the first-stage amplifier.

4. The operational amplifier according to claim 1, wherein the tail bias node is a terminal of a bias resistor of the first-stage amplifier.

5. The operational amplifier according to claim 1, wherein the multi-stage amplifier is a three-stage amplifier, the drain of the first start-up transistor is connected to a gate of a third input transistor of a second-stage amplifier, and the drain of the second start-up transistor is connected to a gate of a fourth input transistor of the second-stage amplifier.

6. The operational amplifier according to claim 1, wherein the operational amplifier further comprises:
   a stability compensation circuit, comprising a first resistor, a second resistor, a first capacitor, and a second capacitor, wherein a first terminal of the first capacitor is connected to a drain of a third input transistor of the second or higher-stage amplifier, a second terminal of the first capacitor is connected to a first terminal of the first resistor, and a second terminal of the first resistor is connected to a drain of a first input transistor of the first-stage amplifier; and
   wherein a first terminal of the second capacitor is connected to a drain of the fourth input transistor of the second or higher-stage amplifier, a second terminal of the second capacitor is connected to a first terminal of the second resistor, and a second terminal of the second resistor is connected to a drain of a second input transistor of the first-stage amplifier.

7. The operational amplifier according to claim 1, wherein the operational amplifier further comprises a common mode detection circuit, and the common mode detection circuit comprises:
   a first input terminal, configured to receive a first differential output voltage output by the operational amplifier;
   a second input terminal, configured to receive a second differential output voltage output by the operational amplifier; and
   an output terminal, configured to output a common mode output voltage, wherein the common mode output voltage is an average value of the first differential output voltage and the second differential output voltage.

8. The operational amplifier according to claim 7, wherein the common mode detection circuit further comprises: a third resistor and a fourth resistor, wherein a first terminal of the third resistor is connected to a first differential output terminal of the operational amplifier, a second terminal of the third resistor is connected to a first terminal of the fourth resistor, a second terminal of the fourth resistor is connected to a second differential output terminal of the operational amplifier, and the second terminal of the third resistor is an output terminal of the common mode detection circuit.

9. The operational amplifier according to claim 7, wherein the operational amplifier further comprises:
   a common mode loop compensation circuit, comprising a third capacitor and a fourth capacitor, wherein a first terminal of the third capacitor is connected to the first differential output terminal of the operational amplifier, a second terminal of the third capacitor is connected to a first terminal of the fourth capacitor, and a second terminal of the fourth capacitor is connected to the second differential output terminal of the operational amplifier.

10. The operational amplifier according to claim 7, wherein the operational amplifier further comprises a common mode negative feedback circuit, the common mode negative feedback circuit comprises an error amplifier, a first input terminal of the error amplifier is configured to receive a common mode reference voltage of the operational amplifier, a second input terminal of the error amplifier is configured to receive the common mode output voltage output by the common mode detection circuit, and an output terminal of the error amplifier is connected to a bias circuit of the operational amplifier.

11. A chip, wherein the chip comprises an operational amplifier comprising:
   a multi-stage amplifier; and
   a start-up circuit, comprising a first start-up transistor and a second start-up transistor, wherein a source of the first start-up transistor and a source of the second start-up transistor are connected to a tail bias node of a first-stage amplifier in the multi-stage amplifier, a gate of the first start-up transistor and a gate of the second start-up transistor are configured to connect to a first bias voltage, and a drain of the first start-up transistor and a drain of the second start-up transistor are connected to input terminals of a second or higher-stage amplifier.

12. An electronic device, wherein the electronic device comprises an operational amplifier comprising:
   a multi-stage amplifier; and
   a start-up circuit, comprising a first start-up transistor and a second start-up transistor, wherein a source of the first start-up transistor and a source of the second start-up transistor are connected to a tail bias node of a first-stage amplifier in the multi-stage amplifier, a gate of the first start-up transistor and a gate of the second start-up transistor are configured to connect to a first bias voltage, and a drain of the first start-up transistor and a drain of the second start-up transistor are connected to input terminals of a second or higher-stage amplifier.

13. The chip according to claim 11, wherein the first bias voltage is set, so that when an input transistor pair of the first-stage amplifier is not turned on, $|V_{GS}|>|V_{th}|$, and after the operational amplifier is started, $|V_{GS}|<|V_{th}|$, wherein $V_{GS}$ represents a gate-source voltage of each of the first start-up transistor and the second start-up transistor, and $V_{th}$ represents a threshold voltage of each of the first start-up transistor and the second start-up transistor.

14. The chip according to claim 11, wherein the tail bias node is a drain of a tail bias transistor of the first-stage amplifier.

15. The chip according to claim 11, wherein the tail bias node is a terminal of a bias resistor of the first-stage amplifier.

16. The chip according to claim 11, wherein the multi-stage amplifier comprises a three-stage amplifier, the drain of the first start-up transistor is connected to a gate of a third input transistor of a second-stage amplifier, and the drain of the second start-up transistor is connected to a gate of a fourth input transistor of the second-stage amplifier.

17. The electronic device according to claim 12, wherein the first bias voltage is set, so that when an input transistor pair of the first-stage amplifier is not turned on, $|V_{GS}|>|V_{th}|$, and after the operational amplifier is started, $|V_{GS}|<|V_{th}|$, wherein $V_{GS}$ represents a gate-source voltage of each of the first start-up transistor and the second start-up transistor, and $V_{th}$ represents a threshold voltage of each of the first start-up transistor and the second start-up transistor.

18. The electronic device according to claim 12, wherein the tail bias node is a drain of a tail bias transistor of the first-stage amplifier.

19. The electronic device according to claim 12, wherein the tail bias node is a terminal of a bias resistor of the first-stage amplifier.

20. The electronic device according to claim 12, wherein the operational amplifier comprises a three-stage amplifier, the drain of the first start-up transistor is connected to a gate of a third input transistor of a second-stage amplifier, and the drain of the second start-up transistor is connected to a gate of a fourth input transistor of the second-stage amplifier.

* * * * *